(12) United States Patent
Lee

(10) Patent No.: US 6,732,786 B1
(45) Date of Patent: May 11, 2004

(54) EDGE-MOUNTED HEAT DISSIPATION DEVICE HAVING TOP-AND-BOTTOM FAN STRUCTURE

(75) Inventor: Kuo-Shao Lee, Taipei (TW)

(73) Assignee: Taiwan TriGem Information Co., Ltd., Taipei (TW)

( * ) Notice: Subject to any disclaimer, the term of this patent is extended or adjusted under 35 U.S.C. 154(b) by 0 days.

(21) Appl. No.: 10/283,843

(22) Filed: Oct. 29, 2002

(51) Int. Cl.[7] .................................................. F28F 7/00
(52) U.S. Cl. .................. 165/80.3; 165/122; 165/104.33; 257/722; 257/715; 361/697; 361/700; 174/15.2; 174/16.3
(58) Field of Search ............................... 165/80.3, 121, 165/122, 104.21, 104.26, 104.33; 257/722, 715; 361/697, 700; 174/15.2, 16.3

(56) References Cited

U.S. PATENT DOCUMENTS 3,739,234 A * 6/1973 Bylund et al. .............. 257/722
6,041,850 A * 3/2000 Esser et al. ............. 165/104.33
6,105,662 A * 8/2000 Suzuki ................... 165/104.33

* cited by examiner

Primary Examiner—Christopher Atkinson

(57) ABSTRACT

A heat dissipation device is mounted to an edge of a circuit board for removing heat from an electronic device mounted on the circuit board. The heat dissipation device includes a contact pad made of thermally conductive material and positioned on the electronic device. A top-and-bottom fan structure includes a casing defining an air passage in fluid communication with a front opening to which a heat sink is mounted and top and bottom openings to which top and bottom fans are respectively mounted. Heat pipes extend between the contact pad and the heat sink. Air is sucked into the casing by the fans and flows through the air passage to the heat sink for carrying heat away from the heat sink. The casing is mounted to an edge of the circuit board with the top and bottom fans respectively located above and below the circuit board. Side openings are defined in the casing for discharging air into upper and lower sides of the circuit board for simultaneously cooling the upper and lower sides of the circuit board.

3 Claims, 5 Drawing Sheets

EDGE-MOUNTED HEAT DISSIPATION DEVICE HAVING TOP-AND-BOTTOM FAN STRUCTURE

FIELD OF THE INVENTION

The present invention relates generally to a heat dissipation device for edge-mounting to a circuit board to remove heat from a heat generating electronic device mounted to the circuit board, and in particular to a heat dissipation device comprised of a top-and-bottom fan structure for efficiently removing heat from the heat generating device and at the same time cooling both sides of the circuit board.

BACKGROUND OF THE INVENTION

A lot of electronic devices, such as central processing units, generate heat when they are in operation. The heat must be timely removed otherwise the electronic device malfunctions due to improper high temperature caused by the heat. Fans are commonly used to generate air streams for carrying heat away from electronic devices that are mounted on a circuit board. However, mounting a fan on a circuit board not only occupies real estate of the circuit board, but also increases the height of the electronic device. This is against the trend of minimization of electronic devices. Thus, fans are positioned remote from the electronic device from which heat is to be carried away and are thermally coupled to the electronic device by heat pipes. This, although reducing the overall height of the electronic device, still requires a large foot print on the circuit board for mounting the fan.

In addition, with the increasing number of electronic parts mounted on both sides of a circuit board the surrounding air is getting hot caused by heat radiation of the electronic parts during the operation of the circuit board. This is adverse to the heat dissipation of the electronic device.

Thus, it is desired to have a heat dissipation device that overcomes the above problems.

SUMMARY OF THE INVENTION

An object of the present invention is to provide a heat dissipation device comprised of a top-and-bottom fan structure that is mounted to an edge of a circuit board for reducing the footprint taken by the heat dissipation device.

Another object of the present invention is to provide a heat dissipation device comprised of two fans that are respectively located above and below a circuit board for causing air flows through upper and lower sides of the circuit board.

A further object of the present invention is to provide a heat dissipation device comprised of a multiplicity of fans for efficiently and effectively removing heat from a heat generating device.

To achieve the above objects, in accordance with the present invention, there is provided a heat dissipation device to be mounted to an edge of a circuit board for removing heat from an electronic device mounted on the circuit board. The heat dissipation device comprises a contact pad made of thermally conductive material and positioned on the electronic device. A multiple fan structure comprises a casing defining an air passage in fluid communication with a front opening to which a heat sink is mounted and top and bottom openings to which top and bottom fans are respectively mounted. Heat pipes extend between the contact pad and the heat sink. Air is sucked into the casing by the fans and flows through the air passage to the heat sink for carrying away heat from the heat sink. The casing is mounted to an edge of the circuit board with the top and bottom fans respectively located above and below the circuit board. Side openings are defined in the casing for discharging air into upper and lower sides of the circuit board for simultaneously cooling the upper and lower sides of the circuit board.

BRIEF DESCRIPTION OF THE DRAWINGS

The present invention will be apparent to those skilled in the art by reading the following description of a preferred embodiment thereof, with reference to the attached drawings, in which.

DETAILED DESCRIPTION OF THE INVENTION

Figure 1:
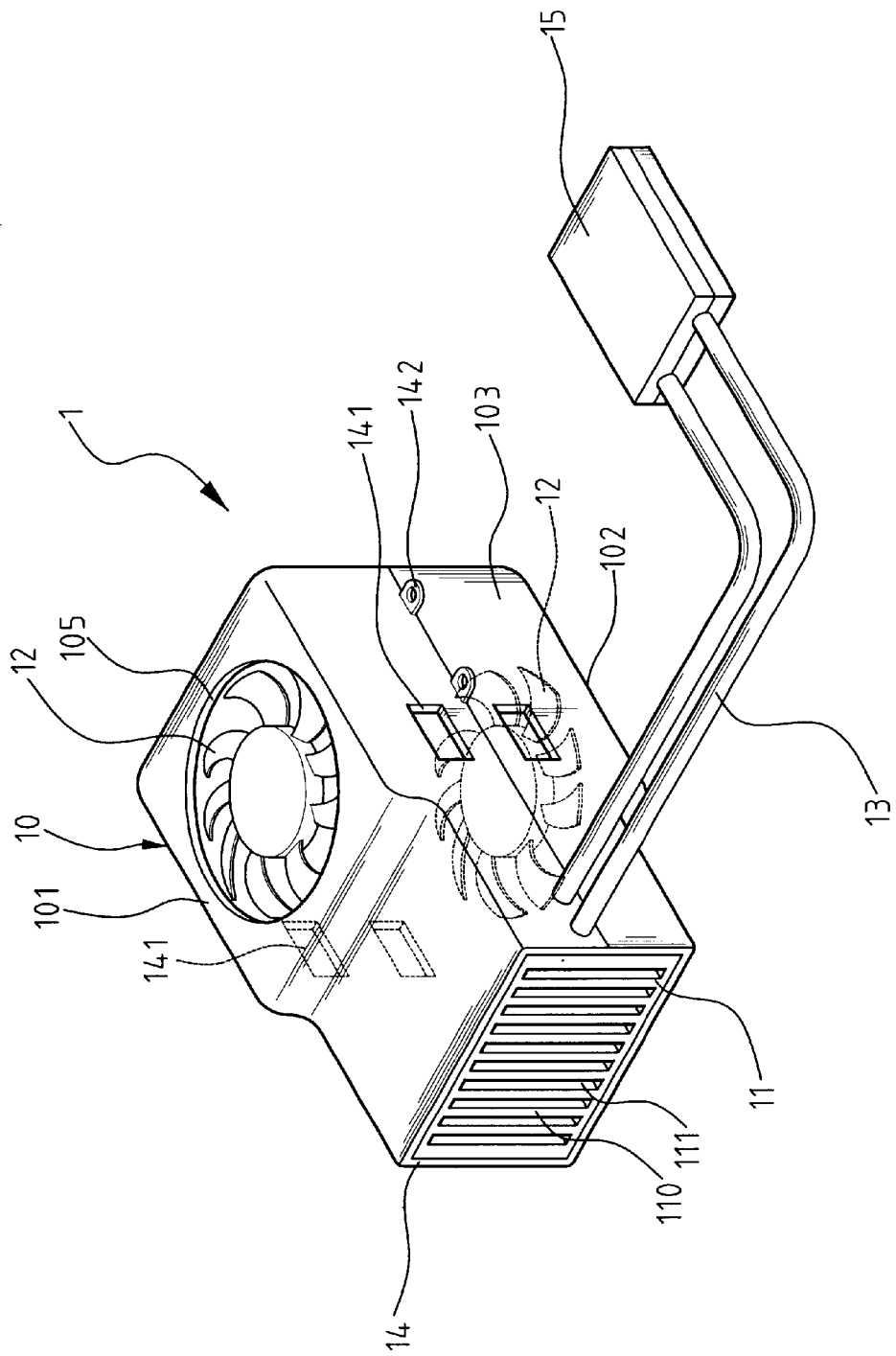
FIG. 1 is a perspective view of a heat dissipation device constructed in accordance with the present invention.
Figure 2:
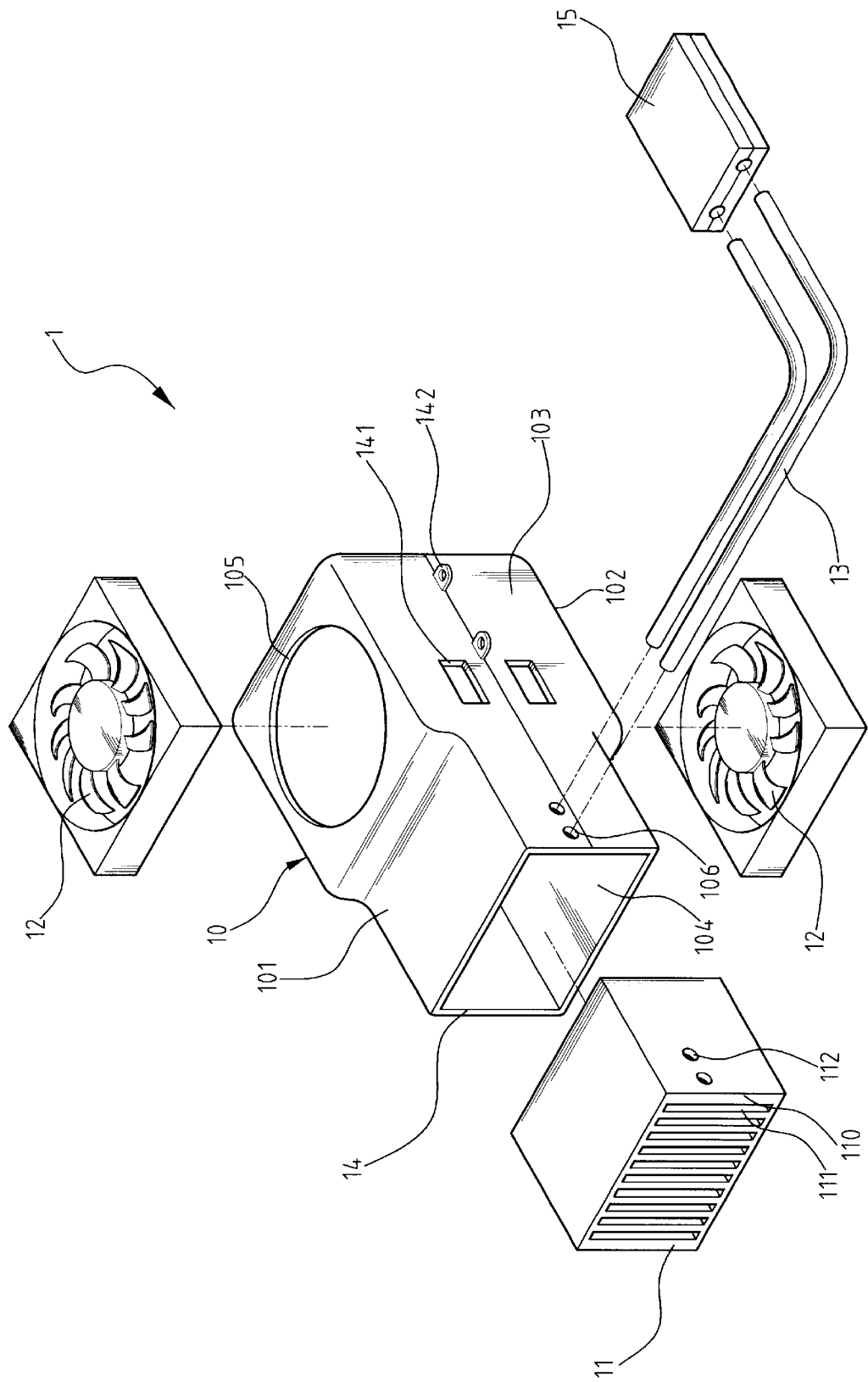
FIG. 2 is an exploded view of the heat dissipation device of the present invention.

With reference to the drawings and in particular to FIGS. 1 and 2, a heat dissipation device constructed in accordance with the present invention, generally designated with reference numeral 1, comprises a top-and-bottom fan structure comprising a casing 10 having a top wall 101 and a bottom wall 102 connected by opposite side walls 103 to define an air passage 104 between the top and bottom walls 101, 102 and extending along the side walls 103. A front opening 14 is defined between the top wall 101 and the bottom wall 102 in a front end of the casing 10 and in fluid communication with the air passage 104. A rear side of the casing 10 is closed.

A heat sink 11 is received and retained in the front opening 14 of the casing 10. The heat sink 11 is made of a heat conductive material and comprises a plurality of spaced fins 110. A passageway 111 is defined between adjacent fins 110 and in fluid communication with the air passage 104 of the casing 10. It is apparent to those having ordinary skills to mount additional heat sinks in the front openings of the casing 10 for additional heat removal capacity.

Openings 105 are defined in top and bottom walls 101, 102 and in fluid communication with the air passage 104 of the casing 10. Fans 12 are respectively mounted to the openings 105. Air is sucked into the casing 10 by the fans 12 via the openings 105 and guided through the air passage 104 between the top and bottom walls 101, 102 toward the heat sink 11. Air then flows through the passageways 111 between the fins 110 of the heat sink 11 to remove heat therefrom. Apparently, there can be more than one fan mounted in each openings 105 in order to increase air flow rate for meeting more severe requirement of heat removal.

Figure 3:
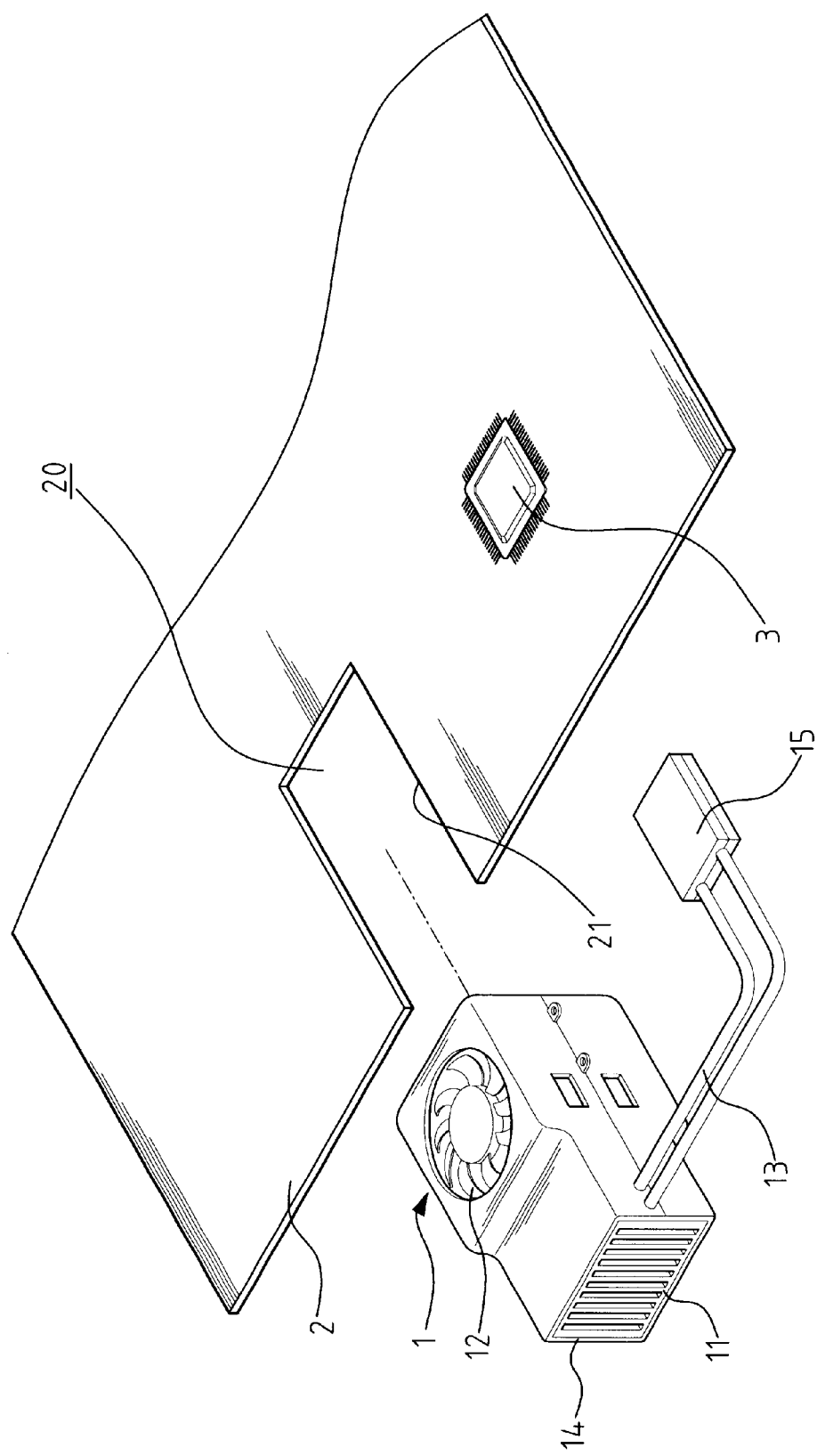
FIG. 3 is a perspective view showing the condition before the heat dissipation device is mounted to an edge of a circuit board.
Figure 4:
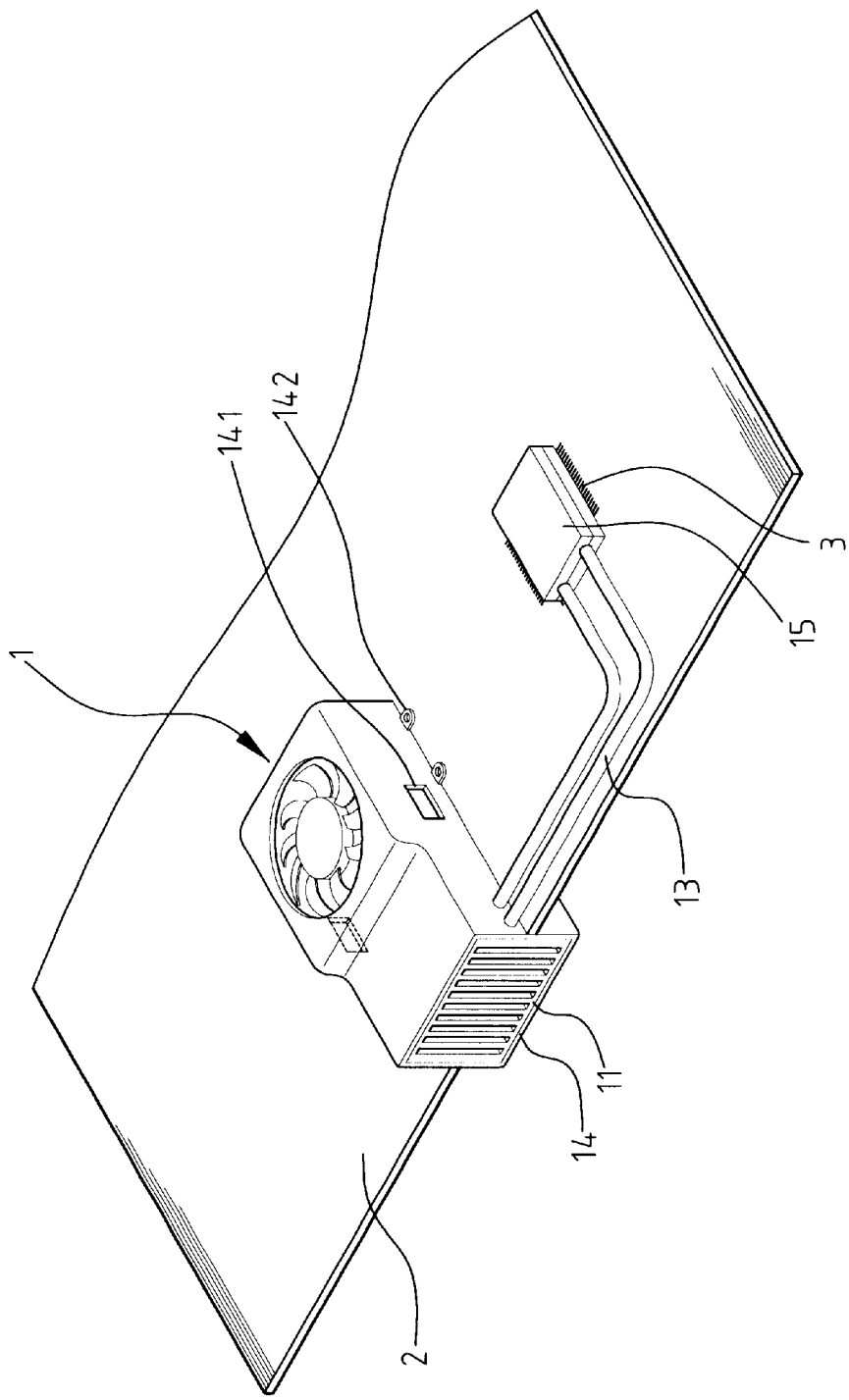
FIG. 4 is similar to FIG. 3 but showing the heat dissipation device mounted to the edge of the circuit board.

Also referring to FIGS. 3 and 4, the heat dissipation device 1 comprises a contact pad 15 made of thermally conductive material. The contact pad 15 is positionable on and in physical engagement with an electronic device 3, such as a central processing unit, that is mounted on a circuit board 2 and that generates heat during the operation thereof. Heat pipes 13 are mechanically and thermally coupled between the contact pad 15 and the heat sink 11. The casing 10 defines holes 106 for the extension of the heat pipes 13. Similarly, holes 112 are defined in the heat sink 11 for receiving, retaining and engaging the heat pipes 13.

The circuit board 2 defines a cutoff 20 sized to receive the casing 10 therein. The cutoff 20 is defined by edges 21 of the circuit board 2. Holed lugs 142 are formed on the side walls 103 substantially midway between the top and bottom walls 101, 102. The lugs 142 extend transversely and are positionable on and supported by the edges 21 of the cutoff 20 of the circuit board 2 so as to mount the heat dissipation device 1 to the edge of the circuit board 2. Fasteners, such as rivets and bolts, can be used to secure the lugs 142 to the circuit board or alternately the lugs 142 are soldered to the circuit board 2.

Figure 5:
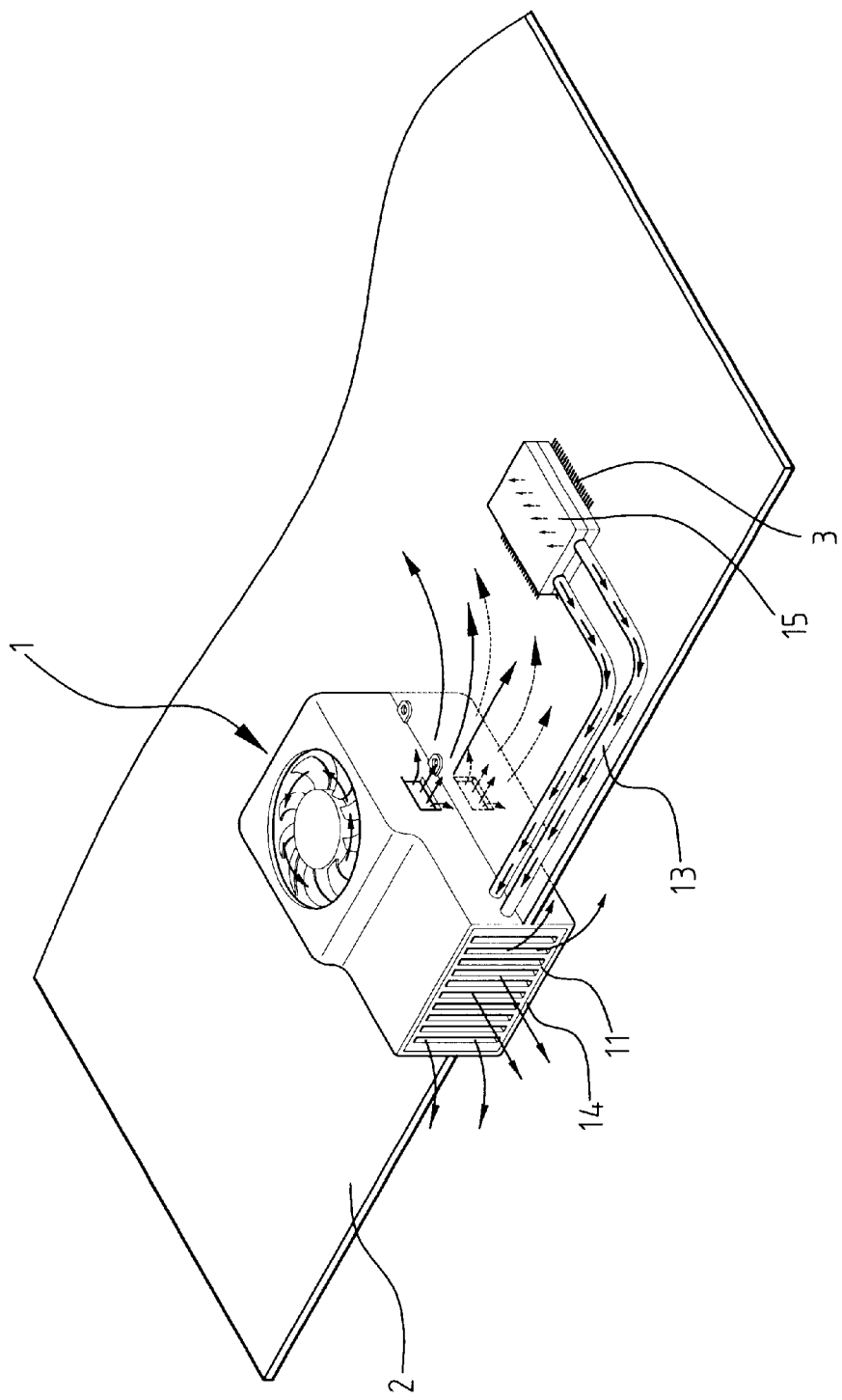
FIG. 5 is a perspective view illustrating air flows caused by the heat dissipation device of the present invention.

Also referring to FIG. 5, when the heat dissipation device 1 is in operation, air is sucked into the casing 10 by the fans 12 via the openings 105. The air flows through the passage 104 defined in the casing 10 toward the heat sink 11 and is then discharged via the passageways 111 between fins 110 of the heat sink 11, as indicated by arrows of FIG. 5. In addition, the air that is sucked into the casing 10 is also discharged out of the casing 10 via the side openings 141, forming air streams traveling across the upper and lower sides of the circuit board 2 for simultaneously cooling the upper and lower sides of the circuit board 2.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A heat dissipation device for edge mounting on a cutoff area of a circuit board, comprising:

a multiple-fan structure having at least one fan disposed on a top end, at least one fan disposed at a bottom end, and at least one side wall being formed with an upper side hole and a lower side hole;

at least one heat sink with spaced fins disposed near said multiple-fan structure; and at least one heat pipe having a first end coupled to a heat generating device on said circuit board and a second end engaged with said at least one heat sink;

wherein said multiple-fan structure is edge mounted on said cutoff area with said upper and lower side holes being respectively above and below said circuit board for directing airflows above and below said circuit board respectively.

2. The heat dissipation device as claimed in claim 1, wherein said first end of said at least one heat pipe is coupled to a heat generating device by a thermally conductive pad.

3. The heat dissipation device as claimed in claim 1, wherein said second end of said at least one beat pipe extends through said spaced fins of said at least one heat sink.

* * * * *